(12) United States Patent
Moyal et al.

(10) Patent No.: US 6,704,381 B1
(45) Date of Patent: *Mar. 9, 2004

(54) FREQUENCY ACQUISITION RATE CONTROL IN PHASE LOCK LOOP CIRCUITS

(75) Inventors: Nathan Y. Moyal, Austin, TX (US); Bertrand J. Williams, Austin, TX (US); Mark Marlett, Georgetown, TX (US); Steve Meyers, Round Rock, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/398,956

(22) Filed: Sep. 17, 1999

(51) Int. Cl.[7] .................................................. H03D 3/24
(52) U.S. Cl. ........................ 375/374; 375/373; 375/375; 375/376; 327/156
(58) Field of Search ............................... 375/374, 376; 327/153, 159; 713/503; 455/73

(56) References Cited

U.S. PATENT DOCUMENTS

| | | | |
|---|---|---|---|
| 4,568,888 A | 2/1986 | Kimura et al. ................. | 331/10 |
| 4,875,108 A | 10/1989 | Minuhin et al. ............... | 360/51 |
| 5,675,291 A | 10/1997 | Sudjian ........................ | 331/17 |
| 5,805,002 A | 9/1998 | Ruetz .......................... | 327/159 |
| 5,950,115 A | 9/1999 | Momtaz et al. ............... | 455/73 |
| 6,011,822 A | 1/2000 | Dreyer ......................... | 375/376 |
| 6,239,632 B1 * | 5/2001 | Moyal et al. ................. | 327/153 |

OTHER PUBLICATIONS

Nathan Y. Moyal et al., Method, Architecture and Circuitry for Controlling the Pulse Width in a Phase and/or Frequency Detector, Ser. No. 09/398,936, filed Sep. 17, 1999.

* cited by examiner

*Primary Examiner*—Stephen Chin
*Assistant Examiner*—Curtis Odom
(74) *Attorney, Agent, or Firm*—Christopher P. Maiorana, P.C.

(57) ABSTRACT

An apparatus comprising a first circuit and a second circuit. The first circuit may be configured to generate (i) a first reference signal in response to a pump-up signal and (ii) a second reference signal in response to a pump-down signal. The second circuit may be configured to generate (a) a first control signal in response to (i) the pump-up signal and (ii) the second reference signal and (b) a second control signal in response to (i) the pump-down signal and (ii) the first reference signal.

19 Claims, 11 Drawing Sheets

FREQUENCY ACQUISITION RATE CONTROL IN PHASE LOCK LOOP CIRCUITS

CROSS-REFERENCE TO RELATED APPLICATIONS

The present invention may relate to application Ser. No. 09/398,936, filed concurrently, which is hereby incorporated by reference in its entirety.

FIELD OF THE INVENTION

The present invention relates to phase lock loop circuits generally and, more particularly, to frequency acquisition rate control in phase lock loop circuits.

BACKGROUND OF THE INVENTION

PLLs are generally considered clock multipliers. For example, an input reference clock having a frequency of 10 Mhz can be multiplied by the PLL to yield an output clock signal having a frequency of 200 Mhz. Ideally, this clock multiplication would result in an output clock that is in perfect phase/frequency with the reference clock. A phase frequency detector (PFD) is used to generate the proper frequency.

Figure 1:
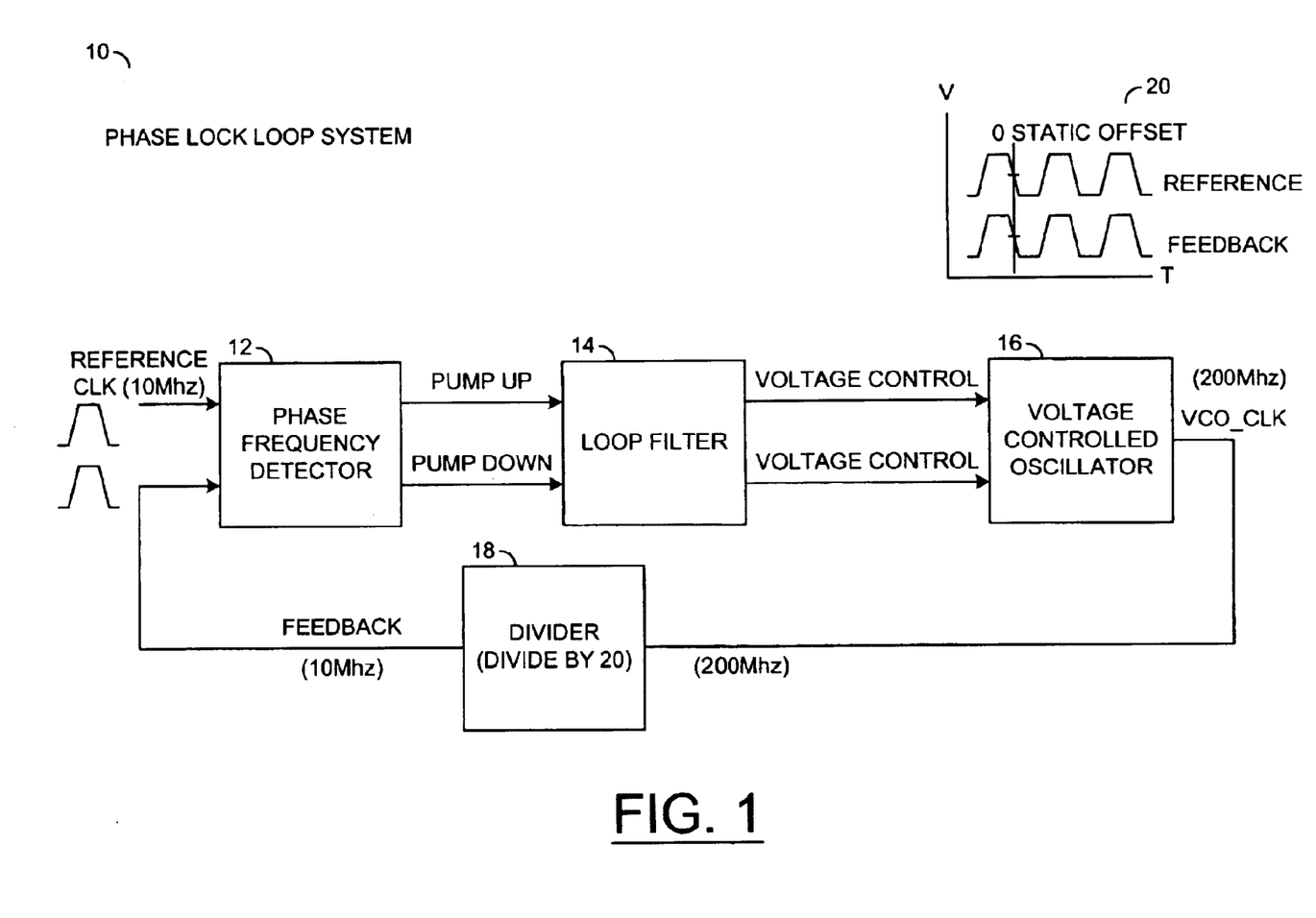
FIG. 1 is a block diagram illustrating a conventional PLL.

FIG. 1 illustrates a conventional phase lock loop circuit 10. The circuit 10 has a phase frequency detector (PFD) 12, a charge pump/loop filter 14, a voltage controlled oscillator 16 and a divider 18. The VCO 16 presents a signal to the divider 18. The divider 18 presents a feedback signal to the PFD 12. The PFD 12 also receives a reference clock signal CLK. The difference in frequency between the reference clock and the feedback signal is used to generate two pump signals that are presented to the charge pump/loop filter 14. The charge pump/loop filter 14 presents a voltage control signal to the voltage controlled oscillator 16 in response to the pump signals. During normal operating conditions, the reference clock is generally synchronized with the feedback signal. Such a synchronization is shown by the block 20.

The acquisition rate of a PLL refers to the rate (e.g., MHz/$\mu$S) that a PLL can acquire lock. The acquisition rate is measured when (i) switching from a first frequency (e.g., A) to a second frequency (e.g., B) or (ii) moving from an unlock state to lock (e.g., start-up). When frequency A is equal to frequency B, the acquisition rate refers to the rate of phase re-acquisition. A typical PLL will lose lock when switching from a reference clock A to a reference clock B. When the PLL loses lock, the output frequency can jump. A jump in frequency can cause problems in systems that are attached to the PLL.

Applications of PLLs in modern computers may require switching between reference clocks that are at about the same frequency and have some random phase difference. In order to minimize frequency jumps when switching between such reference clocks, the acquisition rate should be as low as possible.

Figure 2:
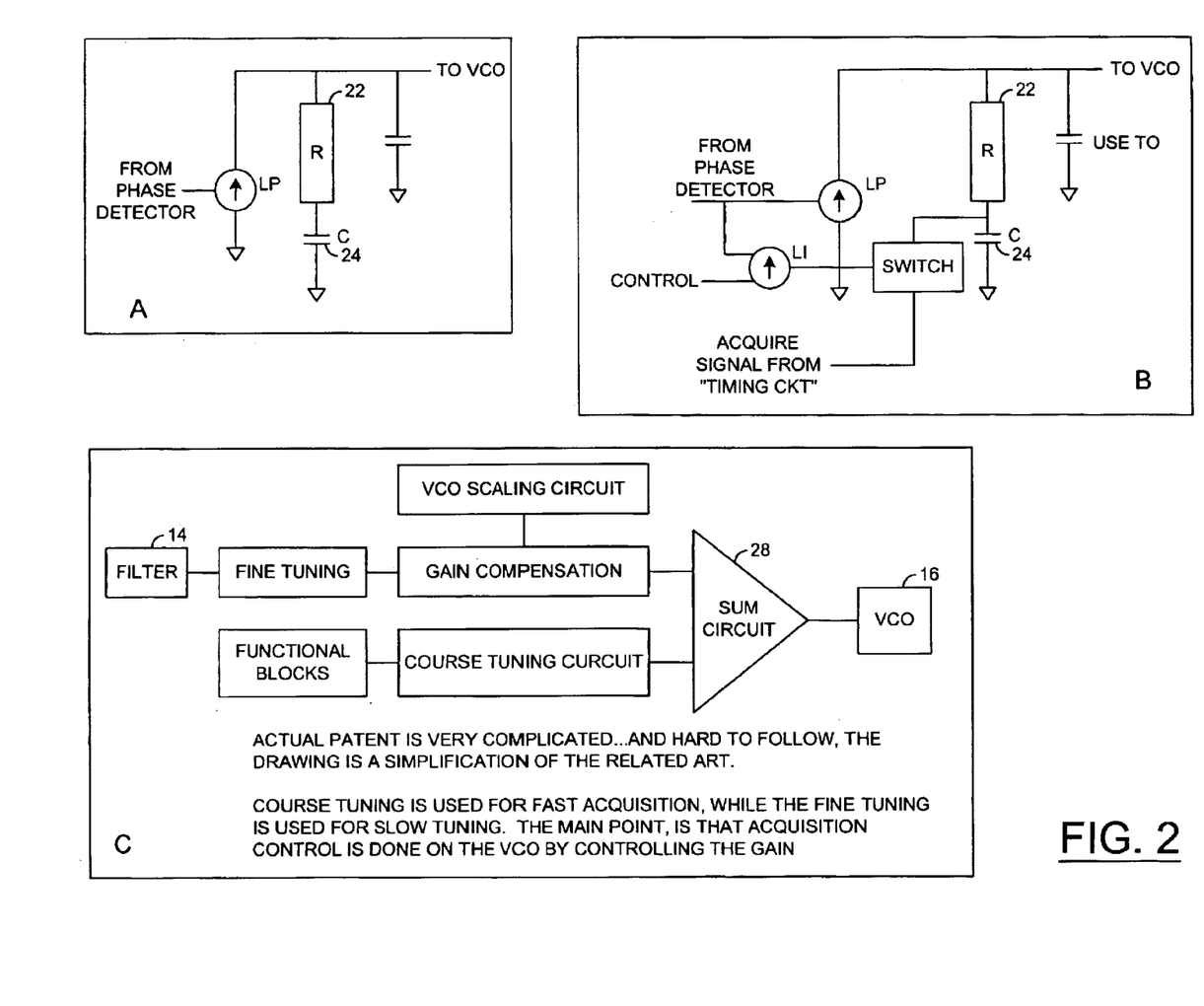
FIGS. 2A–C are diagrams of conventional methods of controlling an acquisition rate in a PLL.

Referring to FIGS. 2A–C, diagrams illustrating conventional methods of controlling the acquisition rate of a PLL are shown. FIG. 2A shows a circuit diagram illustrating a conventional method of reducing the acquisition rate. The acquisition rate of a PLL is reduced by using a resistor 22 and a large capacitor 24 in the loop filter. The large capacitor 24 ensures that the filter node can not change too fast in response to correctional signals from the charge pump. The large capacitor 24 requires a large die area. When switching reference clocks, a flow of current from the charge pump into the filter will result. An immediate voltage jump will appear across the resistor 22, Ip * R, that will result in a frequency jump on the output of the VCO. The large capacitor 24 will not be able to eliminate the frequency jump.

FIG. 2B shows a circuit diagram illustrating a conventional method of increasing the acquisition rate in a PLL. A second current source Ii is used to increase the pump current when the PLL is out of lock. The increased pump current increases the acquisition rate. The use of multiple current sources can also be applied to reduce the acquisition rate. When sensing that the PLL is out of lock, the pump current is reduced until lock is acquired. In order to reduce the acquisition rate, the charge pump current might have to drop by a large factor. Reducing the charge pump current can (i) result in the charge pump not functioning properly due to slew rate limitation, (ii) interfere with the PLL close loop response, (iii) make the PLL more susceptible to outside noise, and/or (iv) require the ability to sense a ~500 pS phase difference (that may not be practical).

FIG. 2C shows a block diagram illustrating a conventional method of altering the acquisition rate in a PLL using a VCO gain control. Controlling the VCO gain requires an additional buffer 28 in front of the VCO. The added buffer 28 is very sensitive to noise. Altering the VCO gain can (i) interfere with the PLL close loop response and (ii) require the ability to sense a ~500 pS phase difference (that may not be practical). The frequency lock range of the PLL will be reduced if the VCO gain is set low to achieve a slow lock time.

SUMMARY OF THE INVENTION

The present invention concerns an apparatus comprising a first circuit and a second circuit. The first circuit may be configured to generate (i) a first reference signal in response to a pump-up signal and (ii) a second reference signal in response to a pump-down signal. The second circuit may be configured to generate (a) a first control signal in response to (i) the pump-up signal and (ii) the second reference signal and (b) a second control signal in response to (i) the pump-down signal and (ii) the first reference signal.

The objects, features and advantages of the present invention include providing an apparatus that controls the frequency acquisition rate of a PLL that may (i) not require a large filter capacitor, (ii) not alter normal PLL close loop response, (iii) not require alteration of the charge pump current, (iv) not cause the charge pump to be sensitive to noise, (v) not require decision making circuitry to decide when to turn on a lock rate control, (vi) be on all the time, (vii) not require additional buffers in front of the VCO, (viii) not affect PLL lock range, and/or (ix) work with existing PLL circuits.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 3:
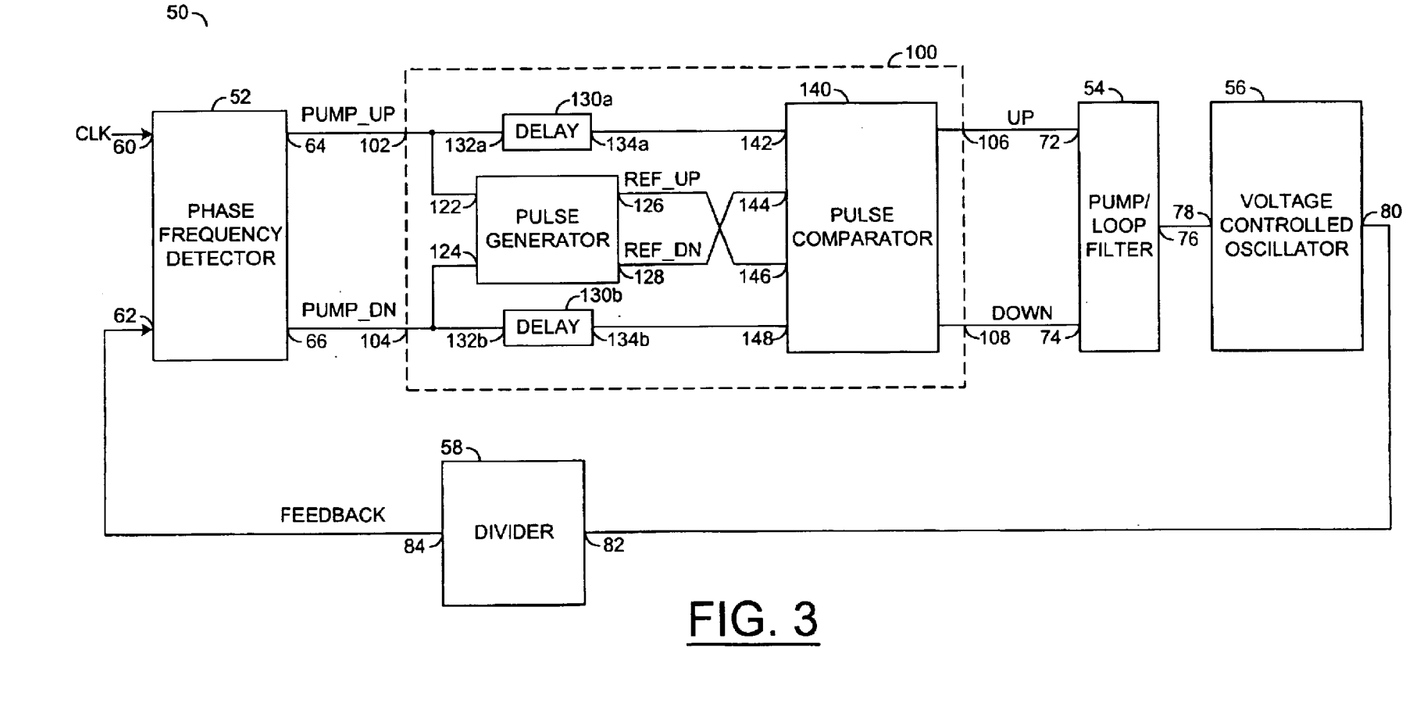
FIG. 3 is a block diagram of a preferred embodiment of the present invention.

Referring to FIG. 3, a block diagram of a circuit 100 illustrating a preferred embodiment of the present invention is shown. The circuit 100 may be implemented, in one example, as a pulse width limiting circuit. The circuit 100 is shown implemented in the context of a phase lock loop (PLL) 50. The circuit 100 may receive signals from a phase frequency detector (PFD) 52. The circuit 100 may present signals to a charge pump/loop filter 54. The circuit 100 may have an input 102, an input 104, an output 106, and an output 108. A first input signal (e.g., PUMP_UP) may be received at the input 102 from the PFD 52. A second input signal (e.g., PUMP_DN) may be received at the input 104 from the PFD 52. The circuit 100 may be configured to generate a first output signal (e.g., UP) at the output 106. The circuit 100 may be configured to generate a second output signal (e.g., DOWN) at the output 108. The signal UP and the signal DOWN may be pump signals. The signal UP and the signal DOWN may be presented to the charge pump/loop filter 54.

The circuit 100 generally comprises a circuit 120 and a circuit 140. In certain design applications, a delay circuit 130a and a delay circuit 130b may be implemented. The circuit 120 may be, in one example, a pulse generator circuit. The circuit 140 may be, in one example, a pulse comparator circuit. The circuit 120 may have an input 122, an input 124, an output 126, and an output 128. The signal PUMP_UP may be received at the input 122. The signal PUMP_DN may be received at the input 124. The circuit 120 may be configured to generate a first reference signal (e.g., REF_UP) at the output 126 in response to the signal PUMP_UP. The circuit 120 may be configured to generate a second reference signal (e.g., REF_DN) at the output 128 in response to the signal PUMP_DN.

The circuit 140 may have an input 142, an input 144, an input 146, an input 148. The signal PUMP_UP may be received at the input 142. The signal REF_DN may be received at the input 144. The signal REF_UP may be received at the input 146. The signal PUMP_DN may be received at the input 148. The circuit 140 may be configured to generate the signal UP. The circuit 140 may be configured to generate the signal DOWN.

Figure 4:
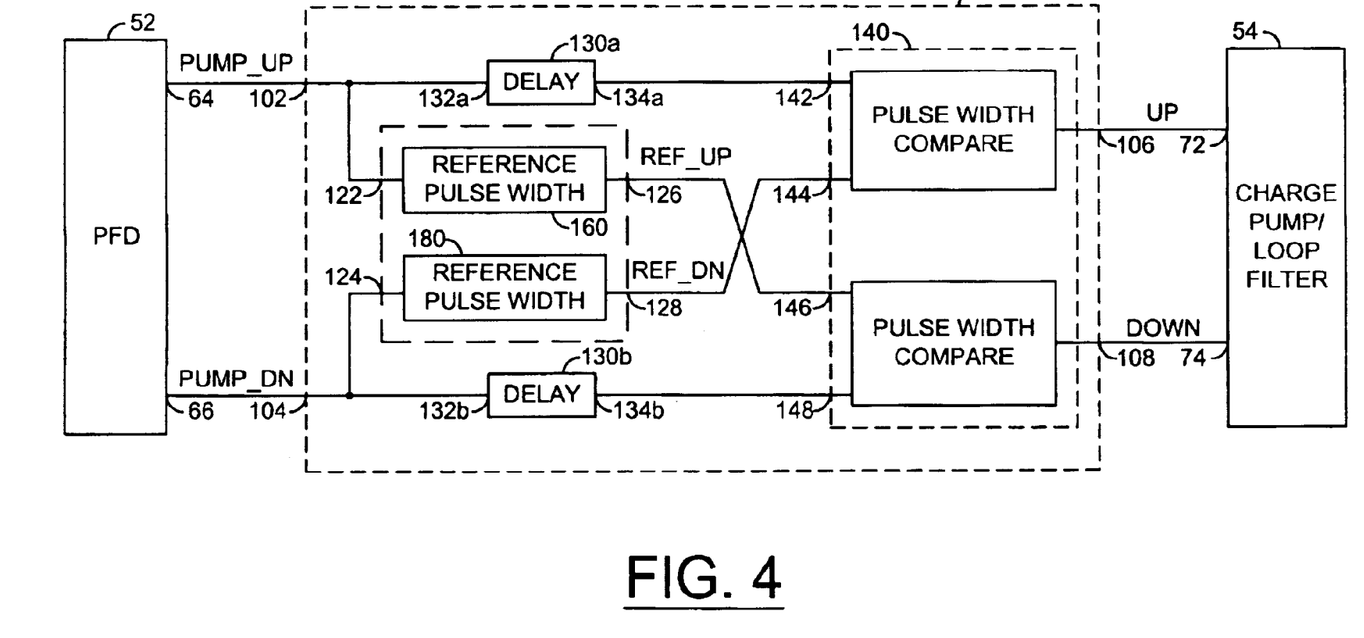
FIG. 4 is a detailed block diagram of the preferred embodiment of the present invention.

Referring to FIG. 4, a detailed block diagram of the circuit 100 is shown. The circuit 120 generally comprises a circuit 160 and a circuit 180. The circuit 160 may be, in one example, a reference pulse width generator. The circuit 180 may be, in one example, a reference pulse width generator. The circuit 160 generally receives the signal PUMP_UP from the input 122. The circuit 160 may be configured to generate the signal REF_UP in response to the signal PUMP_UP.

The circuit 180 generally receives the signal PUMP_DN from the input 124. The circuit 180 may be configured to generate the signal REF_DN in response to the signal PUMP_DN. The circuit 180 generally presents the signal REF_DN at the output 128.

The circuit 140 generally comprises a circuit 200 and a circuit 220. The circuit 200 may be, in one example, a pulse width comparator. The circuit 220 may be, in one example, a pulse width comparator. The circuit 200 generally receives (i) the signal PUMP_UP from the input 142 and (ii) the signal REF_DN from the input 144. The circuit 200 may be configured to generate the signal UP in response to (i) the signal PUMP_UP and (ii) the signal REF_DN.

The circuit 220 generally receives (i) the signal REF_UP from the input 146 and (ii) the signal PUMP_DN from the input 148. The circuit 220 may be configured to generate the signal DOWN in response to (i) the signal PUMP_DN and (ii) the signal REF_UP.

The circuit 200 generally compares the signal PUMP_UP and the signal REF_DN. The circuit 200 generally generates the signal UP with a pulse width equivalent to the shorter of (i) the signal PUMP_UP or (ii) the signal REF_DN.

The circuit 220 generally compares the signal PUMP_DN and the signal REF_UP. The circuit 220 generally generates the signal DOWN with a pulse width equivalent to the shorter of (i) the signal PUMP_DN or (ii) the signal REF_UP.

Figure 5:
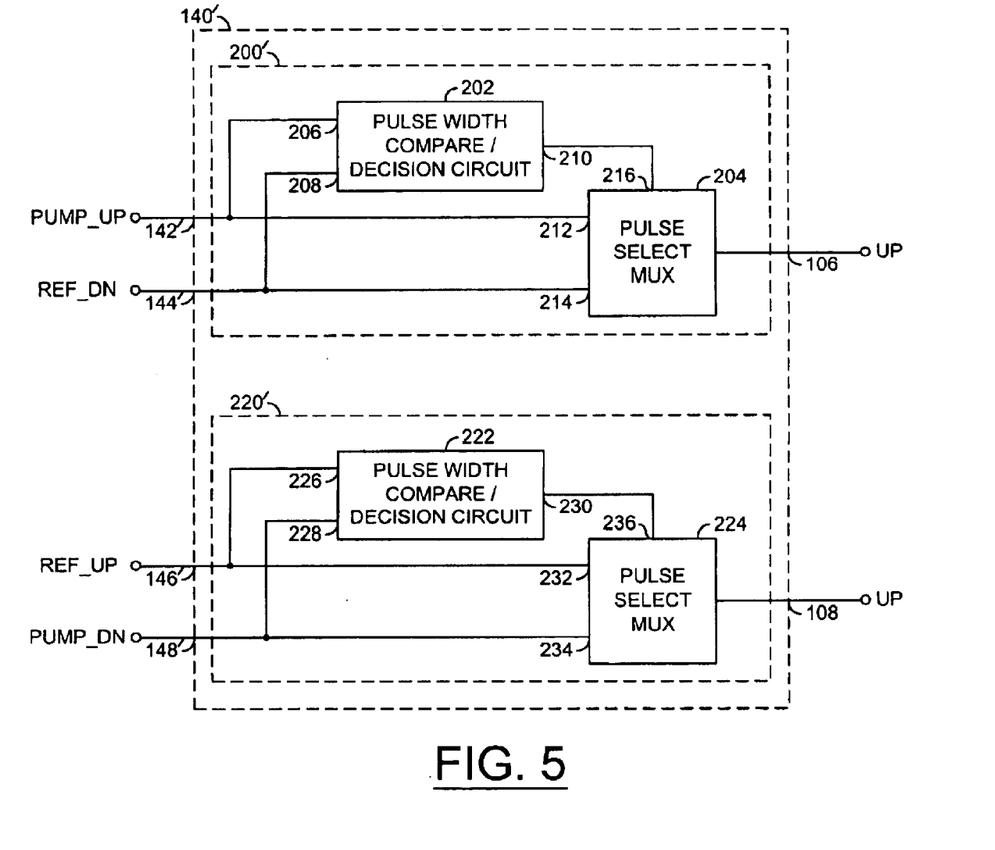
FIG. 5 is a more detailed block diagram of the preferred embodiment of the present invention.

Referring to FIG. 5, a more detailed block diagram of the circuit 140 is shown. The circuit 200 is shown further comprising a circuit 202 and a circuit 204. The circuit 230 is shown further comprising a circuit 222 and a circuit 224. The circuits 202 and 222 may be implemented, in one example, as pulse comparator/decision blocks. The pulse comparator/decision block 202 may present a control signal to an input 216. The control signal may cause the circuit 204 to present the signal UP as either the signal PUMP_UP or the signal REF_DN. Similarly, the pulse comparator/decision block 222 may present a control signal to an input 236. The control signal may cause the circuit 224 to present the signal DOWN as either the signal PUMP_DN or the signal REF_UP.

Figure 6:
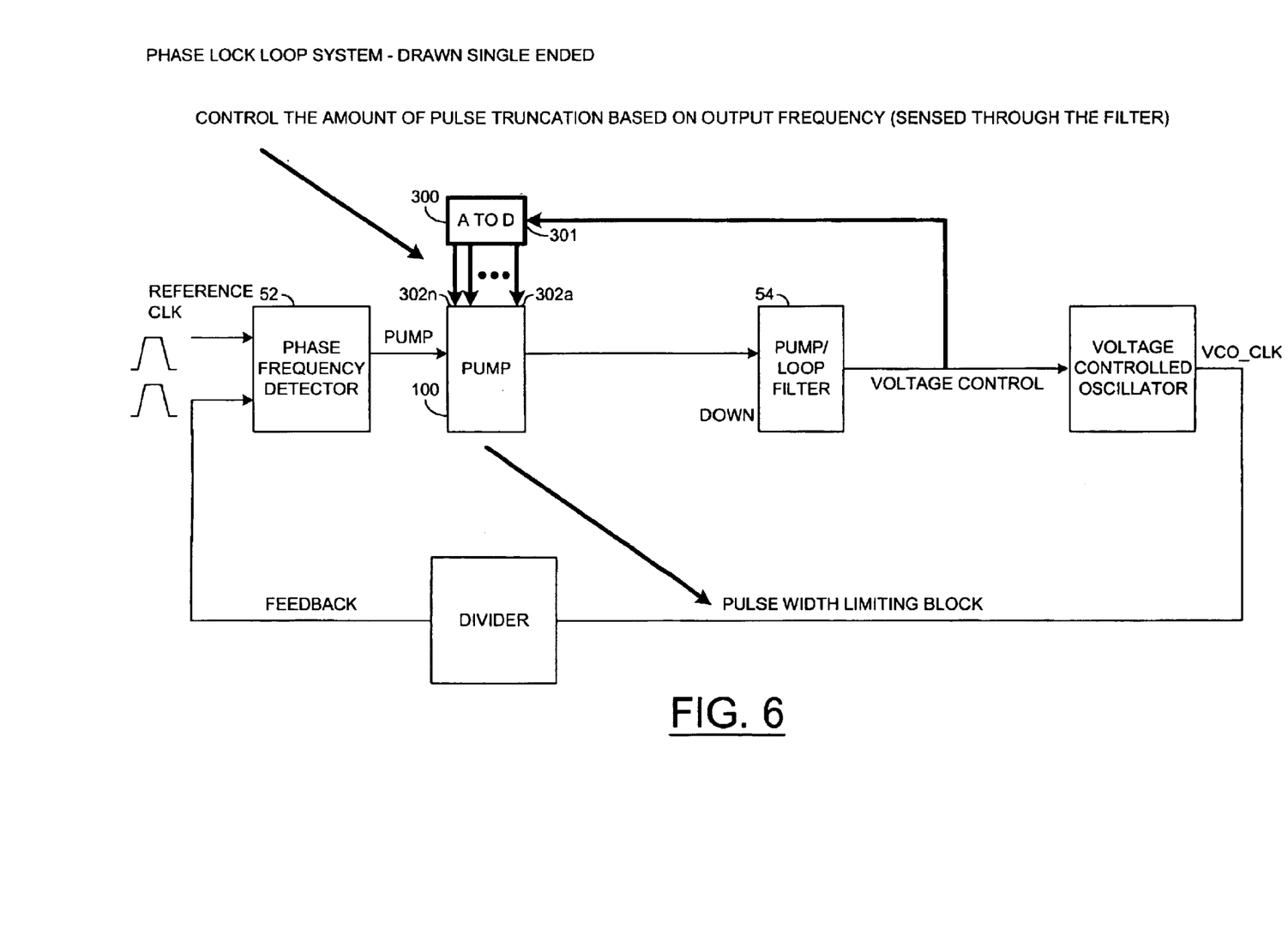
FIGS. 6–11 are block diagrams illustrating alternative embodiments of the present invention.

Referring to FIG. 6, a block diagram illustrating an alternative method of controlling a pulse width is shown. An analog to digital converter 300 may be configured to generate a pulse width control signal in response to a voltage control signal received at an input 301 from the charge pump/loop filter 54. The pulse width control signal may be presented to a number of inputs 302a–302n and may set the amount of pulse truncation.

Figure 7:
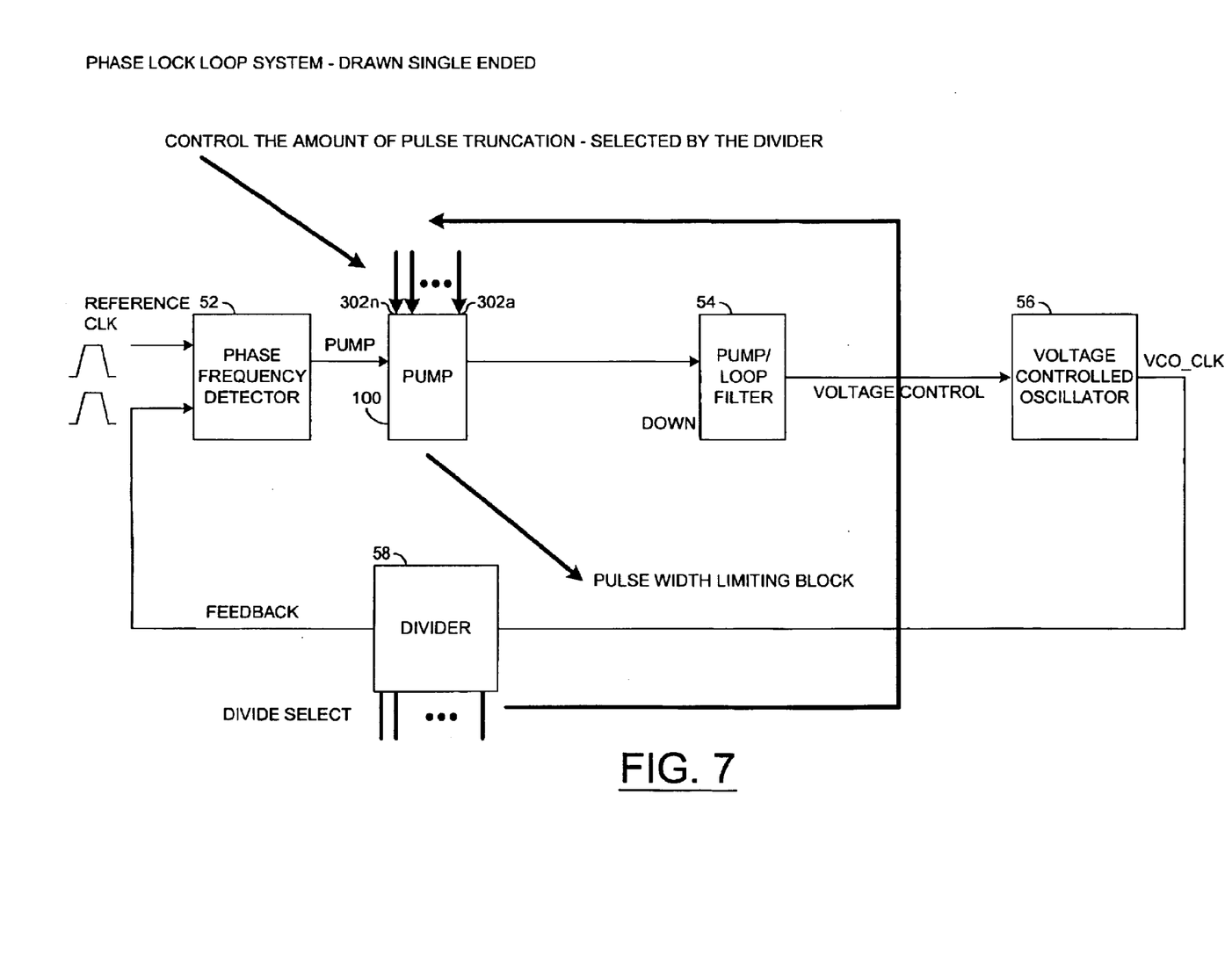

Referring to FIG. 7., a block diagram illustrating another alternative method of controlling pulse width is shown. A control signal (e.g., DIVIDE_SELECT) may be generated by the feedback divider 58. The control signal DIVIDE_SELECT may be presented to the inputs 302a–302n as a pulse width control signal.

Figure 8:
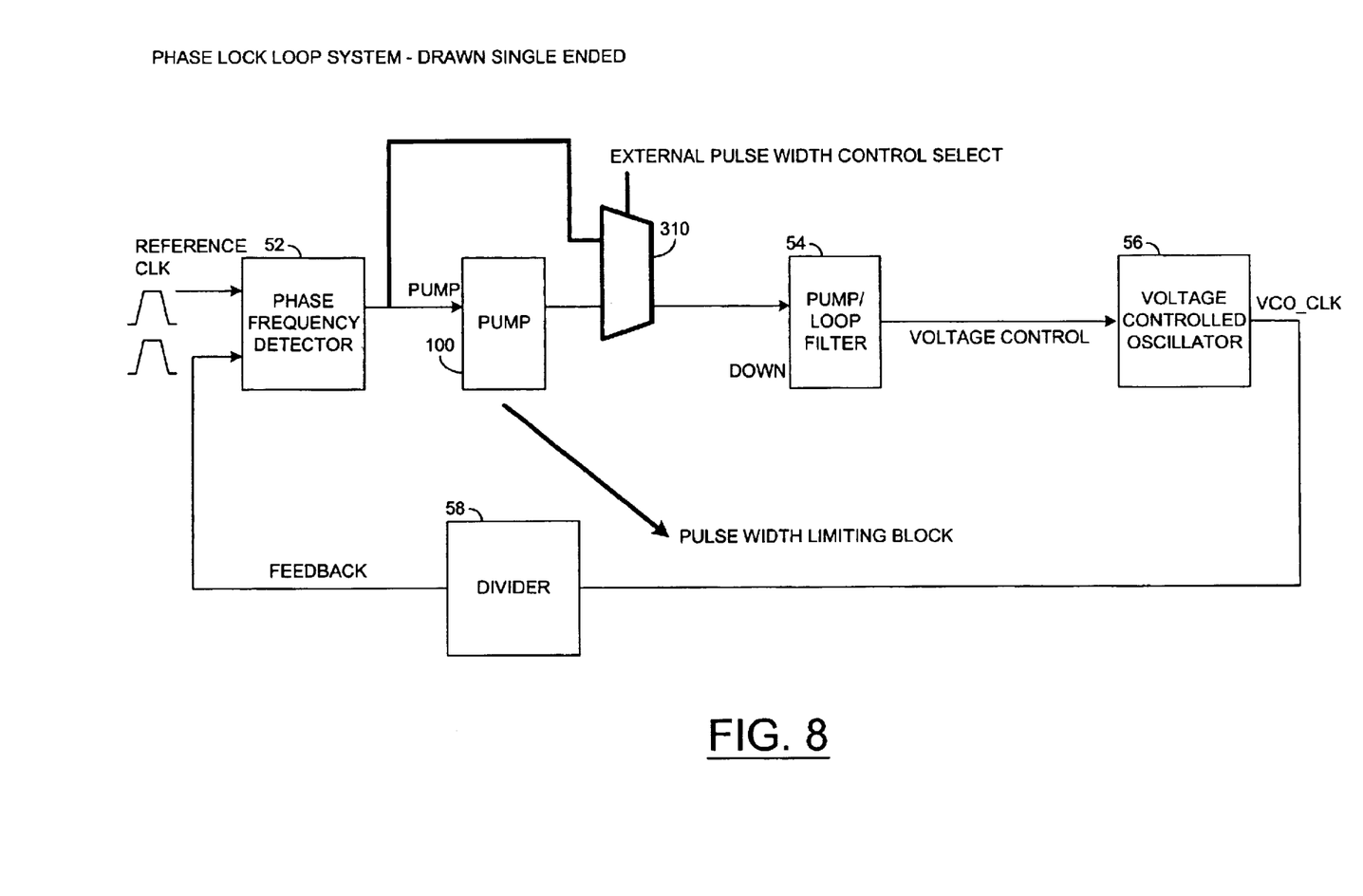

Referring to FIG. 8, a multiplexer circuit 310 may be implemented between the circuit 100 and the pump/loop filter 54. The multiplexer 310 may present a signal to the pump/loop filter 54 by selecting either the signal PUMP_UP or the signal UP. The signal DOWN and the signal PUMP_DN may be similarly multiplexed.

Figure 9:
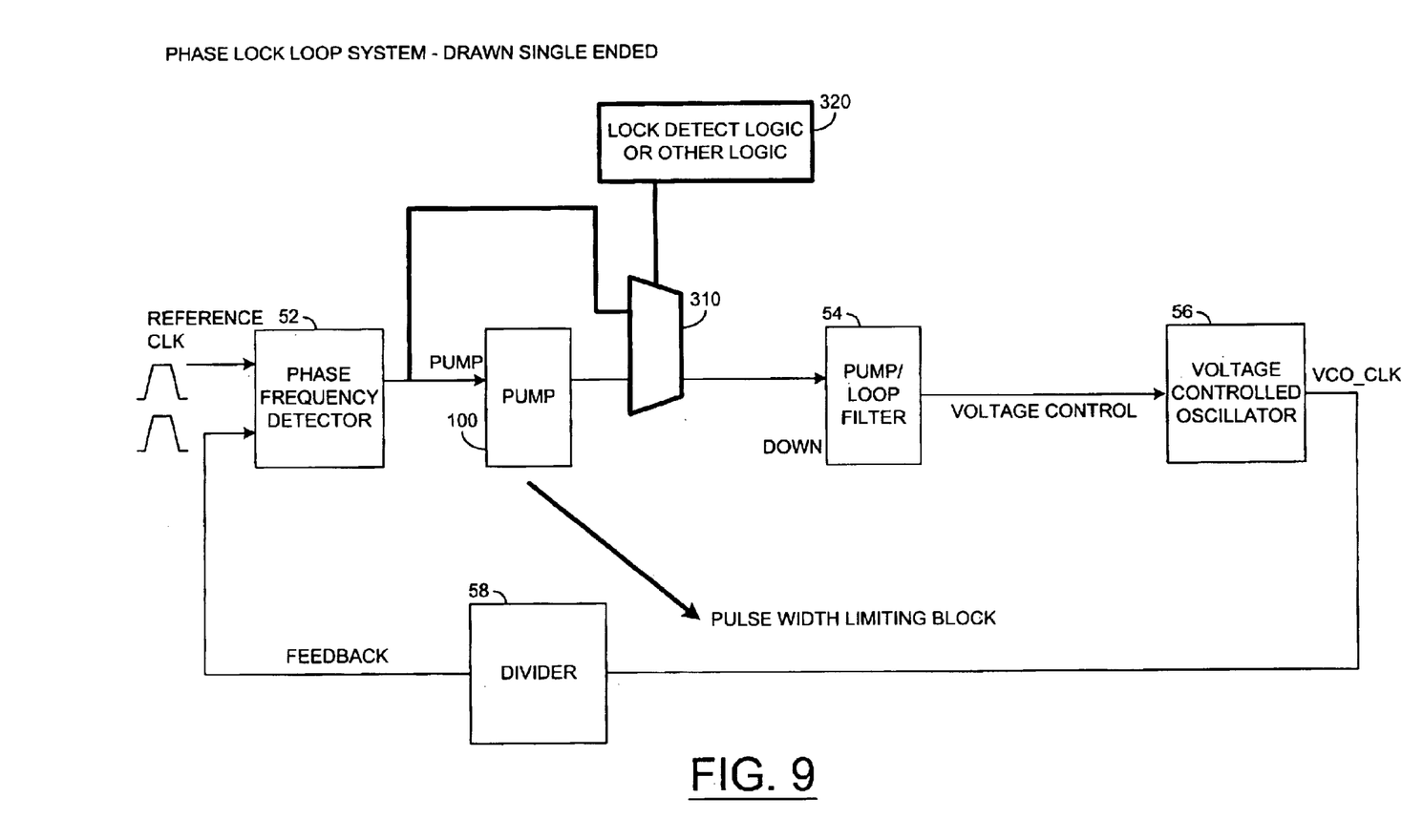

Referring to FIG. 9, a lock detect circuit 320 is shown presenting a signal to the multiplexer 310. The multiplexer 310 is shown on only one pump signal. However, both pump signals may be similarly multiplexed. The lock detect circuit 320 may be implemented as logic configured to control the locking of the PLL by selecting the signal presented to the pump/loop filter 54.

Figure 10:
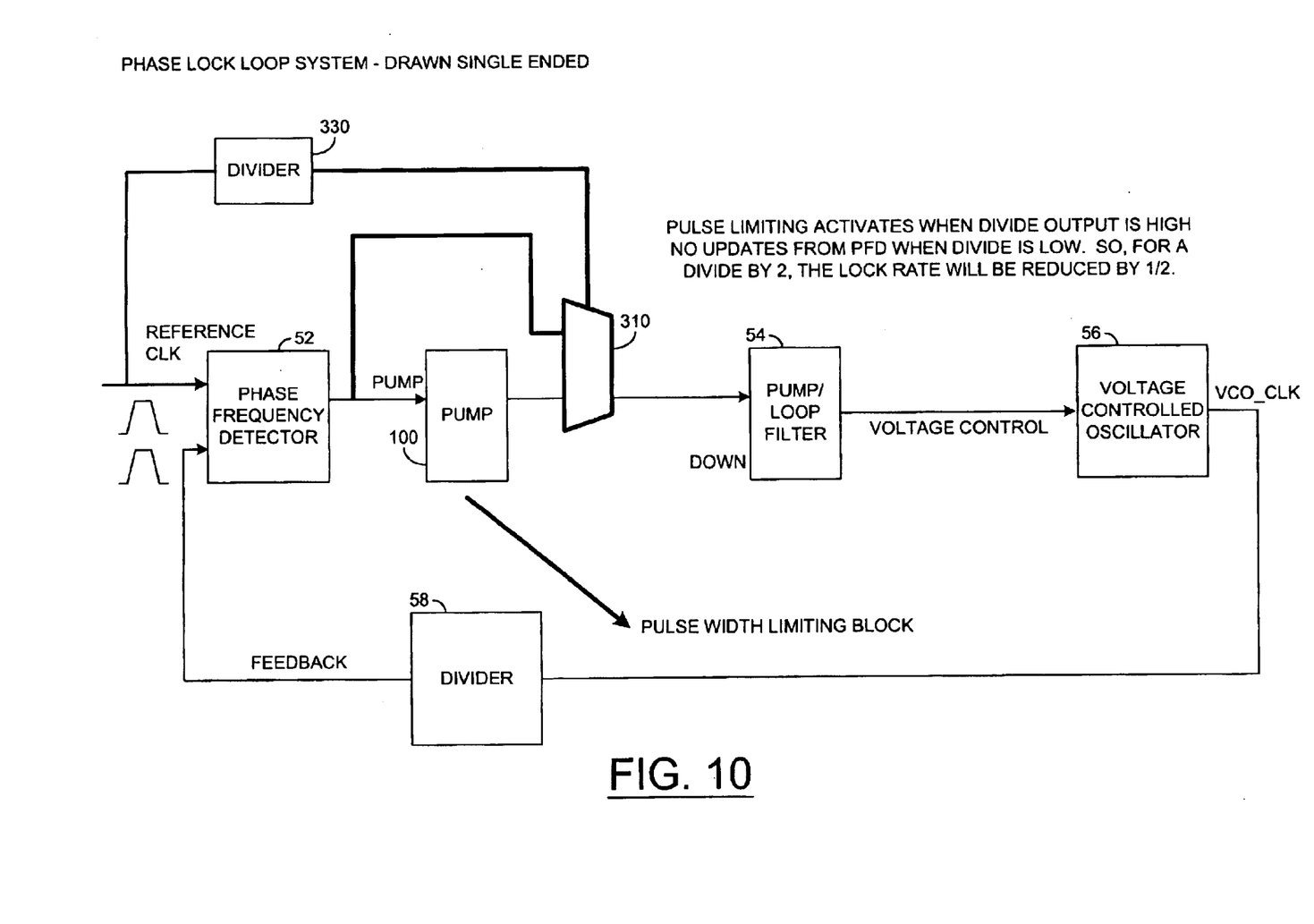
Figure 11:
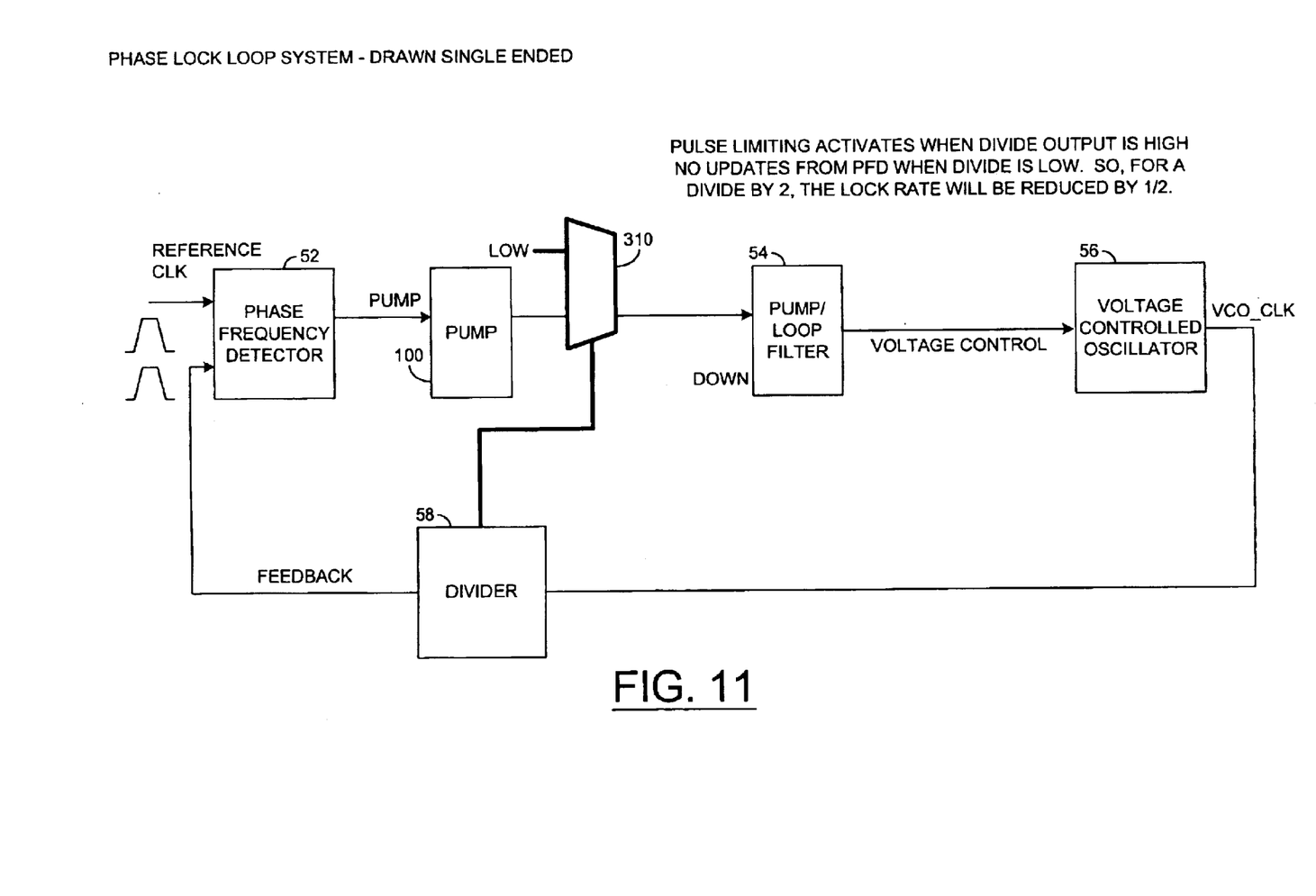

Referring to FIG. 10, a block diagram illustrating the multiplexer 310 configured to select between the pulse width limited signal and a digital LOW. FIG. 10 illustrates making the selection in response to a divided version of the signal CLK received from a divider 330. FIG. 11 illustrates making the selection in response to a signal from the feedback divider 58. In both cases, both pump signals may be similarly multiplexed.

The circuit 100 may compare the pump signals PUMP_UP and PUMP_DN generated by the PFD 52 to one or more reference pulses REF_UP and REF_DN. If the pump signals PUMP_UP and PUMP_DN have a smaller pulse width than the reference pulses REF_UP and REF_DN, the pump signals PUMP_UP and PUMP DN may be presented to the pump/loop filter 54. If the pump signals PUMP_UP and PUMP_DN are larger than the reference pulses REF_UP and REF_DN, the pump signals PUMP_UP and PUMP_DN are reduced to the reference pulses REF_UP and REF_DN. The reference pulses REF_UP and REF_DN may be, in one example, (i) set at a predetermined width, (ii) set in response to the voltage control signal from the charge pump/loop filter 54, or (iii) set in response to the settings of the feedback divider 58.

The circuit 100 may be configured to override the pulse width limitations by presenting (i) the pump signals PUMP_UP and PUMP_DN from the PFD 52 or (ii) a digital LOW. The circuit 100 may be configured to select the override in response to (i) an external pulse width control signal, (ii) a signal from a lock detect or other logic circuit, (iii) the signal CLK, and/or (iv) a signal from the feedback divider 58.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first circuit configured to generate (i) a first reference signal in response to a pump-up signal and (ii) a second reference signal in response to a pump-down signal; and
   a second circuit configured to generate (a) a first control signal in response to (i) said pump-up signal and (ii) said second reference signal and (b) a second control signal in response to (i) said pump-down signal and (ii) said first reference signal.

2. The circuit according to claim 1, wherein said first circuit further comprises:
   a first generator circuit configured to generate said first reference signal as a first reference pulse width signal; and
   a second generator circuit configured to generate said second reference signal as a second reference pulse width signal.

3. The apparatus according to claim 1, wherein said first circuit comprises a pulse generator circuit.

4. The apparatus according to claim 1, wherein said second circuit comprises a pulse comparator circuit.

5. The apparatus according to claim 1, wherein said apparatus comprises a pulse width limiting circuit configured to limit the pulse width of signals generated by a phase and/or frequency detector.

6. The apparatus according to claim 5, wherein said pulse width limitation circuit is configured to limit the pulse width to a predetermined value.

7. The apparatus according to claim 1, wherein said apparatus is implemented in a phase locked loop (PLL).

8. The apparatus according to claim 5, wherein said predetermined value is configured in response to a voltage control signal.

9. The apparatus according to claim 8, wherein said voltage control signal is generated by a charge pump and/or loop filter.

10. The apparatus according to claim 5, wherein said predetermined value is configured in response to settings of a feedback divider.

11. The apparatus according to claim 1, wherein said first control signal is presented to a first multiplexer and said second control signal is presented to a second multiplexer.

12. The apparatus according to claim 11, wherein:
    said first multiplexer selects between said pump-up signal and said first control signal; and
    said second multiplexer selects between said pump-down signal and said second control signal.

13. The apparatus according to claim 12, wherein said first and second multiplexers are configured to respond to an external pulse width control signal.

14. The apparatus according to claim 12, wherein said first and second multiplexers are configured to respond to a signal from a lock detect or other logic circuit.

15. The apparatus according to claim 11, wherein:
    said first multiplexer selects between said first control signal and a first digital signal; and
    said second multiplexer selects between said second control signal and said first digital signal.

16. The apparatus according to claim 15, wherein said first and second multiplexers are configured to respond to a reference clock signal.

17. The apparatus according to claim 16, wherein said first and second multiplexers are configured to respond to a signal from a feedback divider.

18. An apparatus comprising:
    means for generating (i) a first reference signal in response to a pump-up signal and (ii) a second reference signal in response to a pump-down signal; and
    means for generating (a) a first control signal in response to (i) said pump-up signal and (ii) said second reference signal and (b) a second control signal in response to (i) said pump-down signal and (ii) said first reference signal.

19. A method for controlling the rate of frequency acquisition of a phase lock loop comprising the steps of:
    (A) generating a first reference signal in response to a pump-up signal;
    (B) generating a second reference signal in response to a pump-down signal;
    (C) generating a first control signal in response to (i) said pump-up signal and (ii) said second reference signal; and
    (D) generating a second control signal in response to (i) said pump-down signal and (ii) said first reference signal.

* * * * *